United States Patent
Park

(10) Patent No.: US 8,901,599 B2
(45) Date of Patent: Dec. 2, 2014

(54) SEMICONDUCTOR LIGHT EMITTING DEVICE

(75) Inventor: Hyung Jo Park, Gyeonggi-do (KR)

(73) Assignee: LG Innotek Co., Ltd., Seoul (KR)

( * ) Notice: Subject to any disclaimer, the term of this patent is extended or adjusted under 35 U.S.C. 154(b) by 417 days.

(21) Appl. No.: 12/705,368

(22) Filed: Feb. 12, 2010

(65) Prior Publication Data

US 2010/0207160 A1   Aug. 19, 2010

(30) Foreign Application Priority Data

Feb. 16, 2009   (KR) .................. 10-2009-0012478

(51) Int. Cl.
| H01L 33/14 | (2010.01) |
| H01L 33/00 | (2010.01) |
| H01L 33/44 | (2010.01) |
| H01L 33/02 | (2010.01) |

(52) U.S. Cl.
CPC ........... H01L 33/145 (2013.01); *H01L 33/0079* (2013.01); *H01L 33/44* (2013.01); *H01L 33/025* (2013.01)
USPC ........................................................ 257/103

(58) Field of Classification Search
CPC .............................. H01L 33/145; H01L 33/14
USPC .................... 257/103, 79, E33.023, E33.011; 438/22, 45, 46
See application file for complete search history.

(56) References Cited

U.S. PATENT DOCUMENTS

| 5,814,839 A * | 9/1998 | Hosoba ........................... 257/96 |
| 6,242,761 B1 | 6/2001 | Fujimoto et al. |
| 6,420,732 B1 * | 7/2002 | Kung et al. ..................... 257/79 |
| 6,777,717 B1 * | 8/2004 | Karlicek ......................... 257/98 |
| 7,335,920 B2 * | 2/2008 | Denbaars et al. ................ 257/79 |
| 2004/0140474 A1 * | 7/2004 | Ueda et al. ....................... 257/79 |
| 2004/0184499 A1 * | 9/2004 | Kondo ............................ 372/45 |
| 2006/0163586 A1 | 7/2006 | Denbaars et al. |
| 2006/0284188 A1 * | 12/2006 | Shei ............................... 257/79 |
| 2008/0217635 A1 | 9/2008 | Emerson et al. |

FOREIGN PATENT DOCUMENTS

| DE | 19745723 A1 | 12/1998 |
| JP | 11-186600 A | 7/1999 |
| JP | 11-186607 A | 7/1999 |
| KR | 07-326793 A | 12/1995 |
| KR | 10-2009-0116237 A | 11/2009 |
| WO | WO 2006/080958 A1 | 8/2006 |
| WO | WO-2008/083562 A1 | 7/2008 |

* cited by examiner

*Primary Examiner* — Andy Huynh
*Assistant Examiner* — Sitaramarao S Yechuri
(74) *Attorney, Agent, or Firm* — Birch, Stewart, Kolasch & Birch, LLP

(57) ABSTRACT

Disclosed is a semiconductor light emitting device. The semiconductor light emitting device includes a first conductive semiconductor layer including a first carrier blocking layer of semiconductor material; an active layer below the first conductive semiconductor layer; and a second conductive semiconductor layer below the active layer.

19 Claims, 22 Drawing Sheets

SEMICONDUCTOR LIGHT EMITTING DEVICE

CROSS-REFERENCE TO RELATED APPLICATIONS

The present application claims the benefit under 35 U.S.C. 119 of Korean Patent Application No. 10-2009-0012478, filed Feb. 16, 2009, which is hereby incorporated by reference in its entirety.

BACKGROUND

The embodiment relates to a semiconductor light emitting device and a method of manufacturing the same.

Groups III-V nitride semiconductors have been extensively used as main materials for light emitting devices, such as a light emitting diode (LED) or a laser diode (LD), due to the physical and chemical characteristics thereof. For example, the groups III-V nitride semiconductors include a semiconductor material having a compositional formula of $In_xAl_yGa_{1-x-y}N$ ($0 \leq x \leq 1$, $0 \leq y \leq 1$, and $0 \leq x+y \leq 1$).

The LED is a semiconductor device, which transmits signals by converting an electric signal into infrared ray or light using the characteristics of compound semiconductors. The LED is also used as a light source.

The LED or LD using the nitride semiconductor material is mainly used for the light emitting device to provide the light. For instance, the LED or the LD is used as a light source for various products, such as a keypad light emitting part of a cellular phone, an electric signboard, and an illumination device.

SUMMARY

The embodiment provides a semiconductor light emitting device and a method of manufacturing the same, capable of improving light emitting efficiency.

A semiconductor light emitting device according to the embodiment includes a first conductive semiconductor layer including a first carrier blocking layer of semiconductor material; an active layer below the first conductive semiconductor layer; and a second conductive semiconductor layer below the active layer.

A semiconductor light emitting device according to the embodiment includes a first conductive semiconductor layer including a first carrier blocking layer of semiconductor material and a second carrier blocking layer below the first carrier blocking layer; an active layer below the first conductive semiconductor layer; a second conductive semiconductor layer below the active layer; an electrode layer below the second conductive semiconductor layer; a conductive support member below the electrode layer; and a channel layer disposed around the electrode layer and disposed on the conductive support member.

A method of manufacturing a semiconductor light emitting device according to the embodiment includes forming a first conductive semiconductor layer including a first carrier blocking layer of semiconductor material; forming an active layer below the first conductive semiconductor layer; and forming a second conductive semiconductor layer below the active layer.

The embodiment can diffuse current.

The embodiment diffuses carriers injected into an upper electrode of a vertical type semiconductor light emitting device, thereby improving light emitting efficiency and ensuring reliability of devices.

DETAILED DESCRIPTION OF THE EMBODIMENTS

Figure 1:
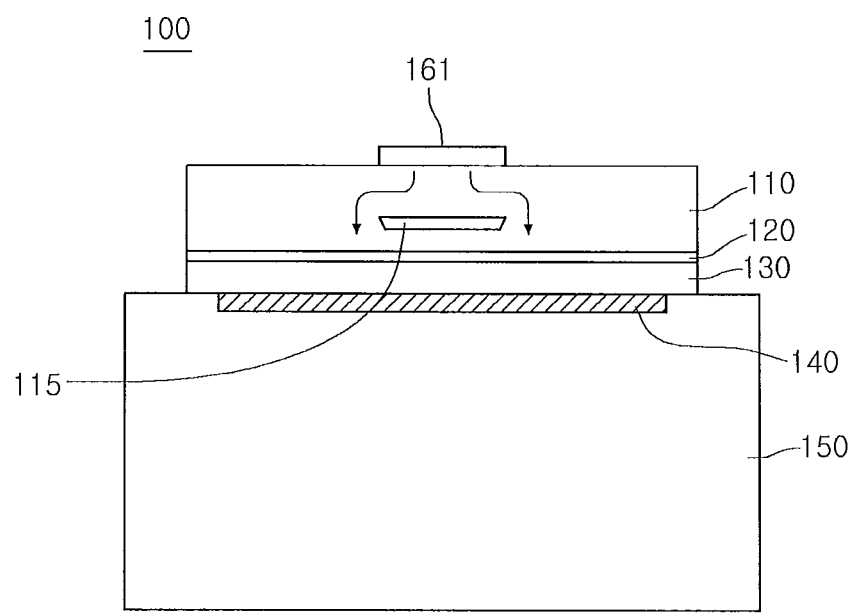
FIG. 1 is a sectional view showing a semiconductor light emitting device according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings can be exaggerated, omitted or schematically drawn for the purpose of convenience or clarity. In addition, the size of elements does not utterly reflect an actual size.

Hereinafter, the embodiments will be described with reference to the accompanying drawings.

FIG. 1 is a sectional view showing a semiconductor light emitting device according to the first embodiment.

Referring to FIG. 1, the semiconductor light emitting device 100 according to the embodiment includes a first conductive semiconductor layer 110, a carrier blocking layer 115, an active layer 120, a second conductive semiconductor layer 130, an electrode layer 140, a conductive support member 150 and a first electrode 161.

The first conductive semiconductor layer 110 may include an n type semiconductor layer doped with a first conductive dopant. The first conductive semiconductor layer 110 may include a compound semiconductor, such as GaN, InN, AlN, InGaN, AlGaN, InAlGaN and AlInN. The first conductive dopant is an n type dopant. For instance, the n type dopant can be selected from the group consisting of Si, Ge, Sn, Se and Te.

Roughness can be formed on the first conductive semiconductor layer 110. In this case, external quantum efficiency can be improved.

The first electrode 161 is formed on the first conductive semiconductor layer 110. The first electrode 161 may have a circular pattern or a polygonal pattern in order to allow carries to be effectively injected into the first electrode 161.

The carrier blocking layer 115 can be disposed in the first conductive semiconductor layer 110. The carrier blocking layer 115 allows the carriers (that is, electrons) injected from the first electrode 161 to be diffused in the horizontal direction.

The carrier blocking layer 115 is disposed corresponding to the first electrode 161 and has a size substantially identical to a size of the first electrode 161. That is, the carrier blocking layer 115 is disposed in a region which corresponds to the pattern of the first electrode 161.

In the first conductive semiconductor layer 110, the carrier blocking layer 115 is closer to the active layer 120 than the first electrode 161.

For example, when the first conductive semiconductor layer 100 includes n-type dopants, a mobility of an electron is so fast. As a result, when the carrier blocking layer 115 is closer to the first electrode 161, the carriers injected from the first electrode 161 can be flow to the area between the carrier blocking layer 115 and the active layer 120.

Accordingly, the carrier blocking layer 115 is necessary to be closer to the active layer 120 than the first electrode 161. That is, the carrier blocking layer 115 allows the carriers (that is, electrons) injected from the first electrode 161 to be more diffused in the horizontal direction and prevent from concentrating the carriers on the active layer 120 under the carrier blocking layer 115.

The carrier blocking layer 115 may include a semiconductor layer doped with a second conductive dopant. For instance, the carrier blocking layer 115 may be formed of one selected from the group consisting of GaN, InN, AlN, InGaN, AlGaN, InAlGaN and AlInN. In addition, the carrier blocking layer 115 may include an undoped semiconductor layer, which is not doped with a conductive dopant. In this case, the carrier blocking layer 115 may be formed of one selected from the group consisting of GaN, InN, AlN, InGaN, AlGaN, InAlGaN and AlInN. In addition, the carrier blocking layer 115 may include a group III-V compound semiconductor having resistance higher than that of the first conductive semiconductor layer 110. For instance, the carrier blocking layer 115 may have thickness of about 5 nm to 500 nm.

The active layer 120 is disposed below the first conductive semiconductor layer 110. The active layer 120 may have a single quantum well structure or a multiple quantum well structure. For instance, the active layer 120 may have a single quantum well structure or a multiple quantum well structure including InGaN well/GaN barrier layers. The material of the quantum well layer and the quantum barrier layer of the active layer 120 may vary depending on the wavelength band of the light, and the embodiment may not limit the material of the active layer 120. A clad layer may be disposed on and/or under the active layer 120.

The second conductive semiconductor layer 130 is disposed below the active layer 120. The second semiconductor layer 130 may include a p type semiconductor layer doped with a second conductive dopant. For instance, the second conductive semiconductor layer 130 may include a compound semiconductor, such as GaN, InN, AlN, InGaN, AlGaN, InAlGaN or AlInN. The second conductive dopant is a p type dopant selected from Mg, Be and Zn.

The first conductive semiconductor layer 110, the active layer 120 and the second conductive semiconductor layer 130 may constitute the light emitting structure, in which the first conductive semiconductor layer 110 is the p type semiconductor layer and the second conductive semiconductor layer 130 is the n type semiconductor layer. In addition, an n type semiconductor layer or a p type semiconductor layer can be disposed below the second conductive semiconductor layer 130. The light emitting structure may include one of an N—P junction structure, a P—N junction structure, an N—P—N junction structure, and a P—N—P junction structure.

If the first conductive semiconductor layer 110 is the p type semiconductor layer, the carrier blocking layer 115 is the n type semiconductor layer.

The electrode layer 140 is formed below the second conductive semiconductor layer 130. The electrode layer 140 may be formed of at least one layer including at least one selected from the group consisting of Ag, Ni, Al, Rh, Pd, Ir, Ru, Mg, Zn, Pt, Au, Hf and combination thereof.

An ohmic contact layer having ohmic characteristics can be disposed between the electrode layer 140 and the second conductive semiconductor layer 130. The ohmic contact layer may have predetermined patterns. The ohmic layer may have a matrix pattern, a cross pattern, a polygonal pattern or a circular pattern. The ohmic layer may be formed of one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide) and ATO (antimony tin oxide). That is, the ohmic layer can selectively employ conductive oxide and metal. For instance, the ohmic layer can be formed in a single layer structure or a multiple layer structure by using at least one of ITO, IZO, IZTO, IAZO, IGZO, IGTO, AZO, ATO, IrOx, RuOx, RuOx/ITO, Ni, Ag, Ni/IrOx/Au, and Ni/IrOx/Au/ITO.

The conductive support member 150 is disposed below the electrode layer 140. The conductive support member 150 is a base substrate and includes Cu, Au, Ni, Mo, Cu—W, or a carrier wafer (for example, Si, Ge, GaAs, ZnO, SiC, GaN, SiGe, or $Ga_2O_3$). The conductive support member 150 may include a conductive sheet. The conductive support member 150 may be bonded or prepared as a plated layer. In addition, the conductive support member 150 may be attached as a conductive sheet.

If forward current is applied to the first electrode 161 and the conductive support member 150, holes are injected into the conductive support member 150 as carriers and electrons are injected into the first electrode 161 as carriers.

If the carrier blocking layer 115 is absent, the carriers injected from the first electrode 161 are concentrated on a local part of the active layer 120 positioned below the first electrode 161. Thus, degradation may occur at the local part of the active layer 120 where the carriers are concentrated.

However, according to the embodiment, the carrier blocking layer 115 formed in the first conductive semiconductor layer 110 blocks the carriers to diffuse the carriers in the horizontal direction. Therefore, the carriers injected from the first electrode 161 are supplied to the whole area of the active layer 120. In this manner, the carriers are diffused by the carrier blocking layer 115, so that the light emitting efficiency of the active layer 120 can be improved.

FIGS. 2 to 15 are views showing the procedure for manufacturing the semiconductor light emitting device according to the first embodiment.

Figure 2:
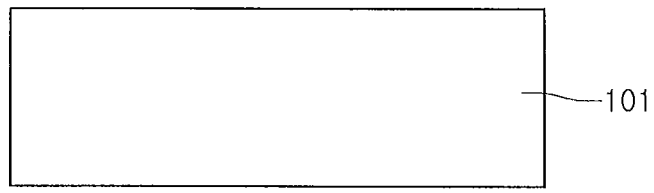
FIGS. 2 to 15 are views showing the procedure for manufacturing a semiconductor light emitting device according to the first embodiment.
Figure 3:
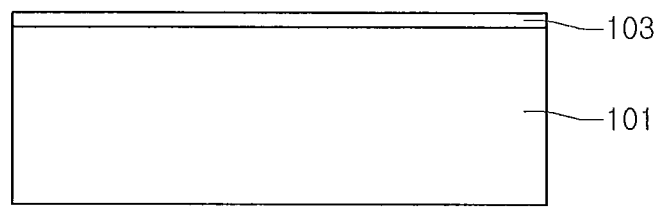
Figure 4:
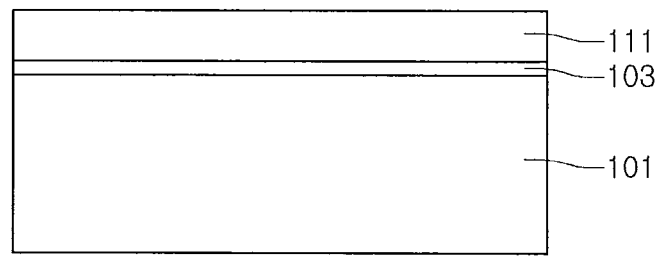

Referring to FIGS. 2 to 4, a buffer layer 103 is formed on a substrate 101, and a first lower conductive semiconductor layer 111 is formed on the buffer layer 103.

The substrate 101 may include one selected from the group consisting of $Al_2O_3$, GaN, SiC, ZnO, Si, GaP, InP, GaAs and conductive substrates. A nitride semiconductor can be grown on the substrate 101. In this case, growth equipment may be selected from the group consisting of E-beam evaporator, PVD (physical vapor deposition), CVD (chemical vapor deposition), PLD (plasma laser deposition), dual-type thermal evaporator, sputtering, and MOCVD (metal organic chemical vapor deposition). However, the embodiment may not limit the growth equipment.

The buffer layer 103 may attenuate the lattice mismatch between the semiconductor layer to be grown later and the substrate 101. The buffer layer 103 may include at least one selected from the group consisting of GaN, InN, AlN, InGaN, AlGaN, InAlGaN, and AlInN. An undoped semiconductor layer can be formed on the buffer layer 103. The undoped semiconductor layer may include an undoped GaN layer, which is not doped with the first or second conductive dopant. In addition, the buffer layer 103 and/or the undoped semiconductor layer may not be formed on the substrate 101.

The first lower conductive semiconductor layer 111 may include an n type semiconductor layer doped with the first conductive dopant. For instance, the first lower conductive semiconductor layer 111 may include a compound semiconductor, such as GaN, InN, AlN, InGaN, AlGaN, InAlGaN or AlInN. The first conductive dopant is an n type dopant, which is selected from the group consisting of Si, Ge, Sn, Se and Te.

Figure 5:
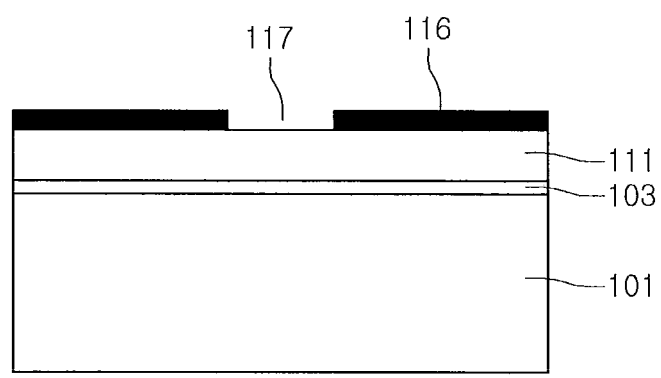
Figure 6:
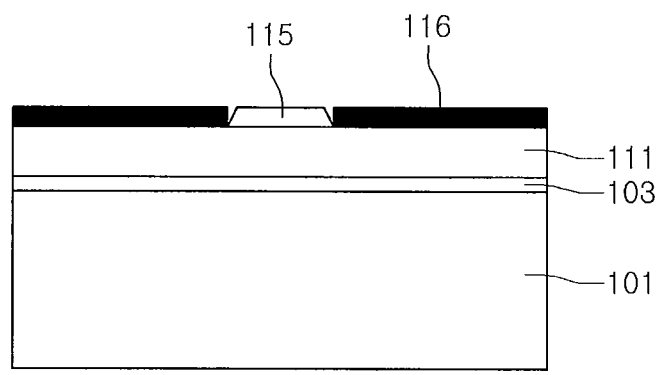
Figure 7:
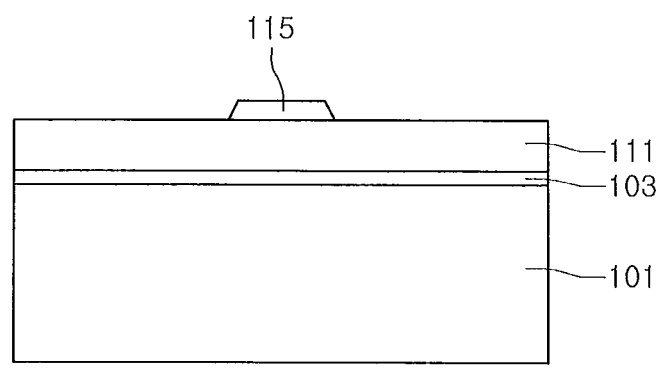
Figure 8:
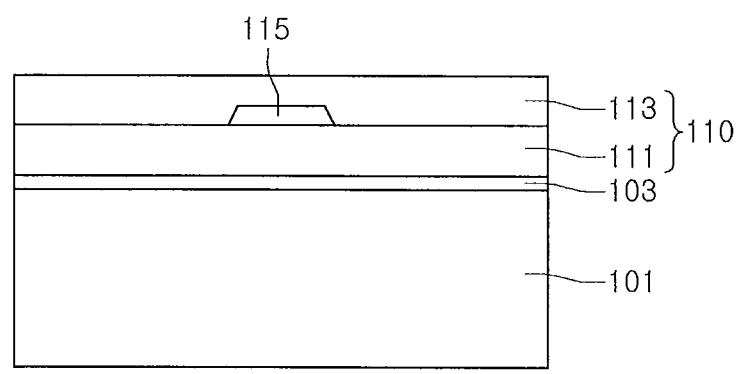
Figure 9:
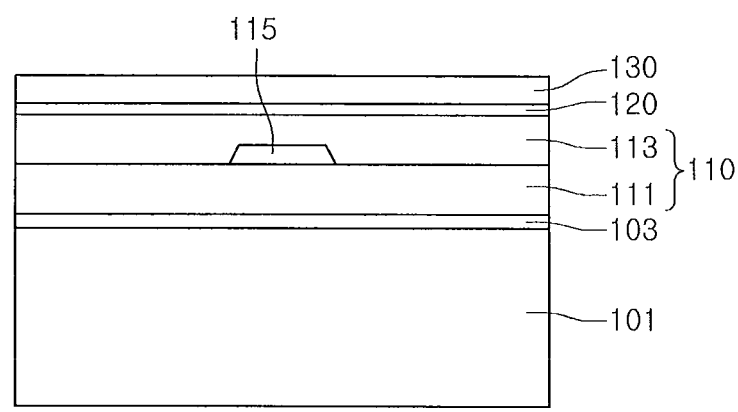
Figure 10:
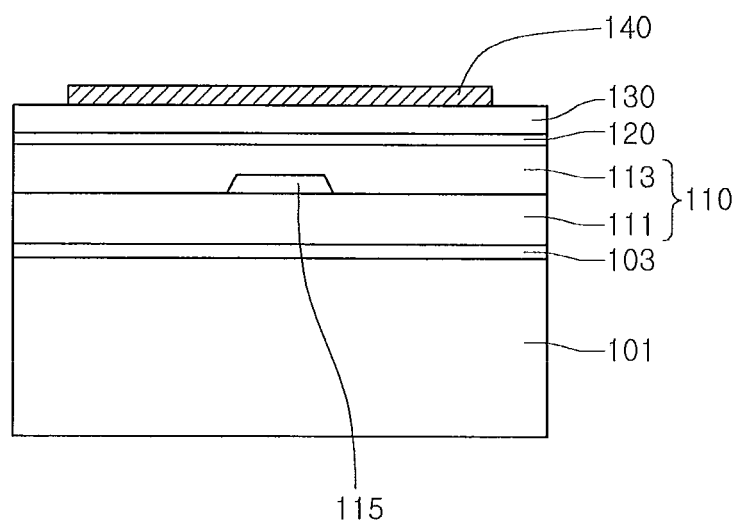
Figure 11:
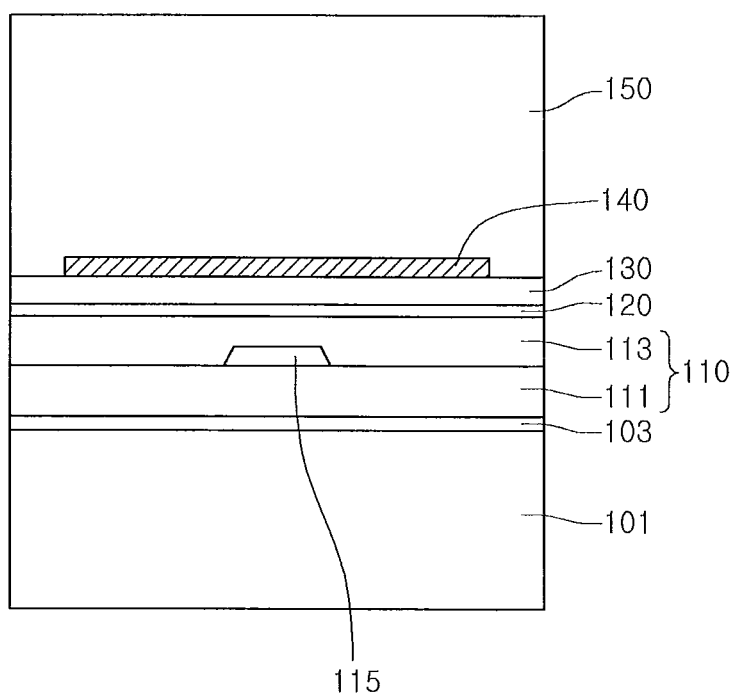

Referring to FIGS. 5 to 7, a mask layer 116 is formed on the first lower conductive semiconductor layer 111 except for a region 117 where the carrier blocking layer 115 will be formed later. Then, the carrier blocking layer 115 is formed on the region 117.

The region 117 is positioned in a pattern area, which is identical to a pattern area of a first electrode pattern to be formed later, and has a size larger or smaller than a size of the first electrode pattern. In addition, the region 117 may be identical to a part of the first electrode pattern.

The carrier blocking layer 115 may include semiconductor material identical to that of the first lower conductive semiconductor layer 111. Thus, degradation of crystal quality, which is caused when the carrier blocking layer 115 includes material different from that of the first lower conductive semiconductor layer 111, can be prevented. In addition, the carrier blocking layer 115 has thickness of about 5 nm to 500 nm on the first lower conductive semiconductor layer 111.

When the carrier blocking layer 115 has been formed, the mask layer 116 is removed.

Referring to FIGS. 8 to 11, a first upper conductive semiconductor layer 113 is formed on the first lower conductive semiconductor layer 111 and the carrier blocking layer 115. The first upper conductive semiconductor layer 113 may include a semiconductor doped with a same dopant type to the dopant doped in the first lower conductive semiconductor layer 111. That is, the first upper conductive semiconductor layer 113 may include a compound semiconductor, such as GaN, InN, AlN, InGaN, AlGaN, InAlGaN or AlInN.

The first lower conductive semiconductor layer 111 and the first upper conductive semiconductor layer 113 may constitute the first conductive semiconductor layer 110.

The carrier blocking layer 115 may include the group III-V semiconductor material, which is doped with the second conductive dopant or not doped with the conductive dopant. In other words, the carrier blocking layer 115 is a semiconductor layer doped with the second conductive dopant or an undoped semiconductor layer. The carrier blocking layer 115 may be formed of one selected from the group consisting of GaN, InN, AlN, InGaN, AlGaN, InAlGaN and AlInN. In addition, the carrier blocking layer 115 may include a group III-V compound semiconductor having resistance higher than that of the first conductive semiconductor layer 110.

The active layer 120 and the second conductive semiconductor layer 130 are sequentially formed on the first conductive semiconductor layer 110. The active layer 120 may have a single quantum well structure or a multiple quantum well structure and the material of the active layer 120 may vary depending on the wavelength band of the light.

The second semiconductor layer 130 may include a p type semiconductor layer doped with a second conductive dopant. For instance, the second conductive semiconductor layer 130 may include a compound semiconductor, such as GaN, InN, AlN, InGaN, AlGaN, InAlGaN or AlInN. The second conductive dopant is a p type dopant selected from Mg, Be and Zn.

The first conductive semiconductor layer 110, the active layer 120 and the second conductive semiconductor layer 130 may constitute the light emitting structure, and another semiconductor layer can be formed on and/or under the light emitting structure. In addition, the light emitting structure may include at least one of an N—P junction structure, a P—N junction structure, an N—P—N junction structure, and a P—N—P junction structure.

The electrode layer 140 can be formed on the second conductive semiconductor layer 130 and the conductive support member 150 can be formed on the electrode layer 140.

The electrode layer 140 can be formed on a part or a whole area of the second conductive semiconductor layer 130. The electrode layer 140 may include a seed metal or a material having reflective metal properties. For instance, the electrode layer 140 may be formed of at least one layer including at least one selected from the group consisting of Ag, Ni, Al, Rh, Pd, Ir, Ru, Mg, Zn, Pt, Au, Hf and combination thereof.

The ohmic contact layer having predetermined patterns can be disposed between the electrode layer 140 and the second conductive semiconductor layer 130. The ohmic layer may have a matrix pattern, a cross pattern, a polygonal pattern or a circular pattern. The ohmic layer may be formed of one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide) and ATO (antimony tin oxide). That is, the ohmic layer can selectively employ conductive oxide and metal. For instance, the ohmic layer can be formed in a single layer structure or a multiple layer structure by using at least one of ITO, IZO, IZTO, IAZO, IGZO, IGTO, AZO, ATO, IrOx, RuOx, RuOx/ITO, Ni, Ag, Ni/IrOx/Au, and Ni/IrOx/Au/ITO.

The conductive support member 150 is a base substrate and includes Cu, Au, Ni, Mo, Cu—W, or a carrier wafer (for example, Si, Ge, GaAs, ZnO, SiC, GaN, SiGe, or $Ga_2O_3$). The conductive support member 150 may include a conductive sheet. The conductive support member 150 may be bonded or prepared as a plated layer. In addition, the conductive support member 150 may be attached as a conductive sheet.

Figure 12:
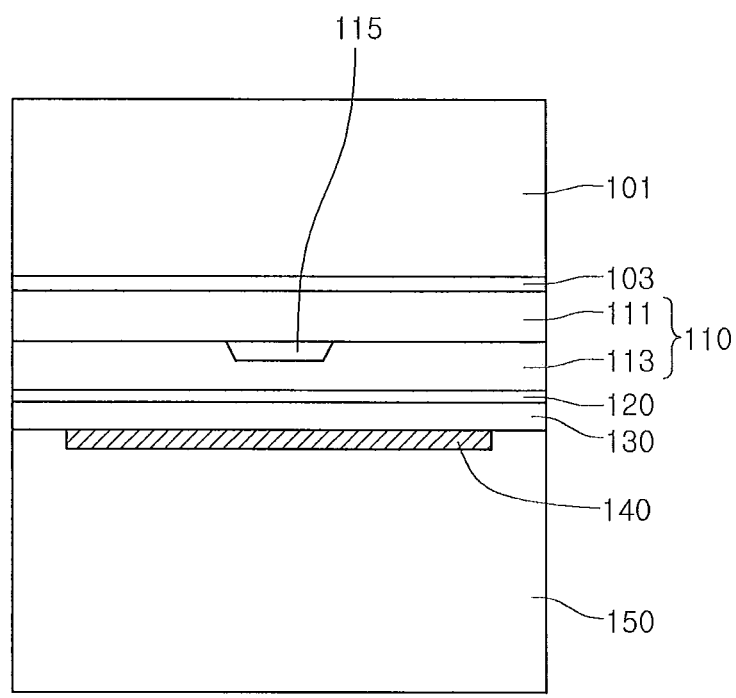
Figure 13:
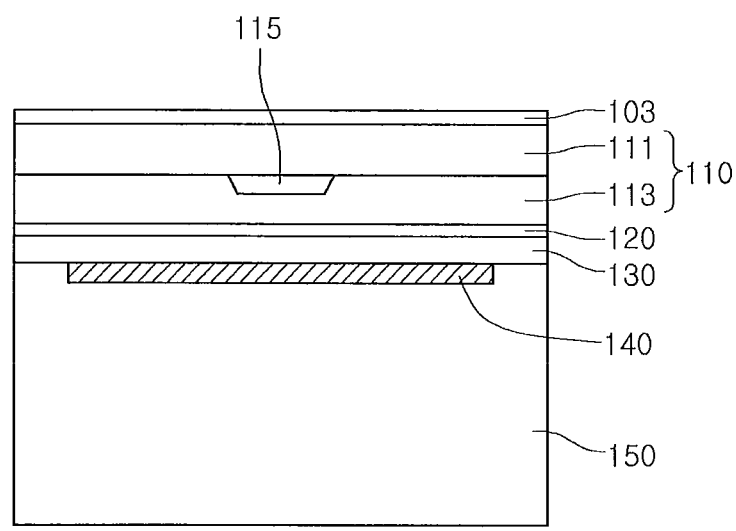
Figure 14:
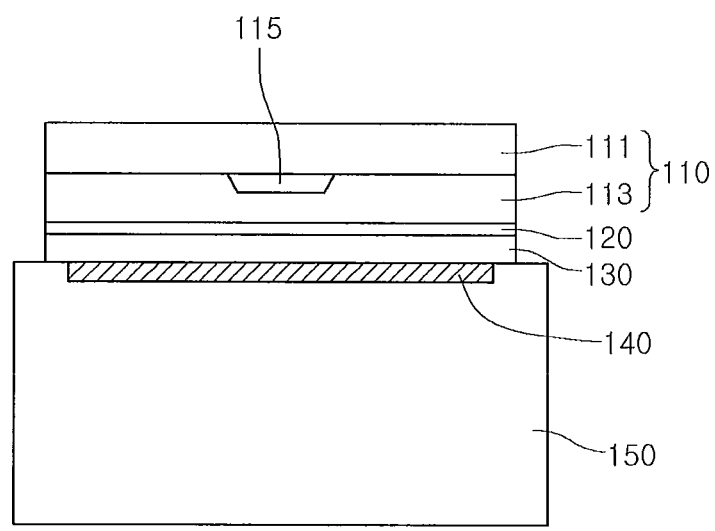

Referring to FIGS. 12 to 14, the conductive support member 150 is positioned below the substrate 101 and the substrate 101 is positioned above the conductive support member 150. In this state, the substrate 101 is removed.

The substrate 101 can be removed through a physical scheme. For instance, the substrate 101 can be removed through an LLO (laser lift off) scheme. That is, laser having a predetermined wavelength band is irradiated onto the substrate 101 to remove the substrate 101.

The substrate 101 and the buffer layer 103 can be removed by using wet etchant. For instance, in a state in which the substrate 101 is not removed, wet etchant is injected into the buffer layer 103 to remove the buffer layer 103, thereby removing the substrate 101. After the substrate 101 has been removed, the surface of the first conductive semiconductor layer 110 is etched through the ICP/RIE (inductively coupled plasma/reactive ion etching) scheme.

Figure 15:
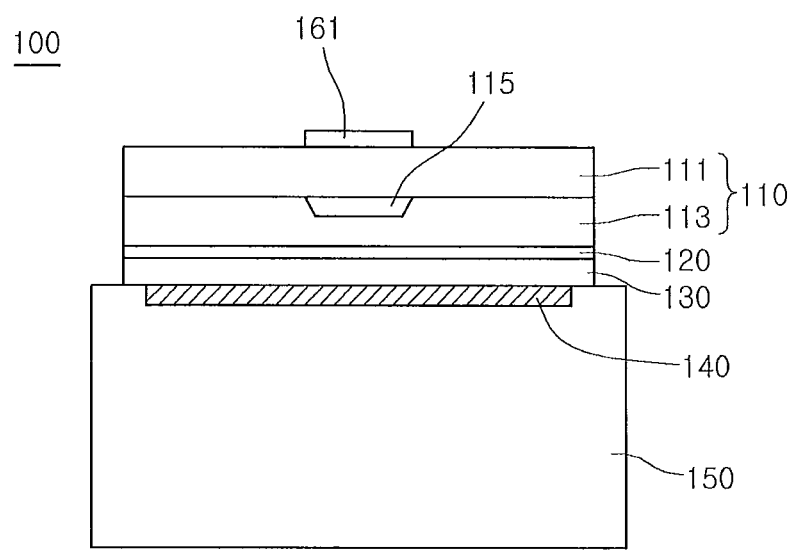

Referring to FIGS. 14 and 15, a mesa etching is performed with respect to a boundary region between chips (that is, the channel area). The mesa etching is performed with respect to the outer peripheral portion of the first conductive semiconductor layer 110 until the top surface of the conductive support member 150 is exposed. The mesa etching may be the dry etching or the wet etching.

The first electrode 161 is formed on the first conductive semiconductor layer 110. The first electrode 161 is disposed corresponding to the carrier blocking layer 115 and has a size substantially identical to a size of the carrier blocking layer 115.

According to the first embodiment, the carrier blocking layer 115 is formed in the first conductive semiconductor layer 110 corresponding to the first electrode 161. Thus, the carrier blocking layer 115 can guide the carriers, which are injected from the first electrode 161 or directed to the first electrode 161, to diffuse the carriers in the horizontal direction. Therefore, the light emitting efficiency can be improved at the active layer 120.

According to the first embodiment, the first conductive semiconductor layer 110 is re-grown to form the carrier blocking layer 115. However, according to another embodiment, the region for the carrier blocking layer 115 is etched after the first conductive semiconductor layer 110 has been grown. In this state, the first conductive semiconductor layer 110 is locally re-grown in the etched region.

Figure 16:
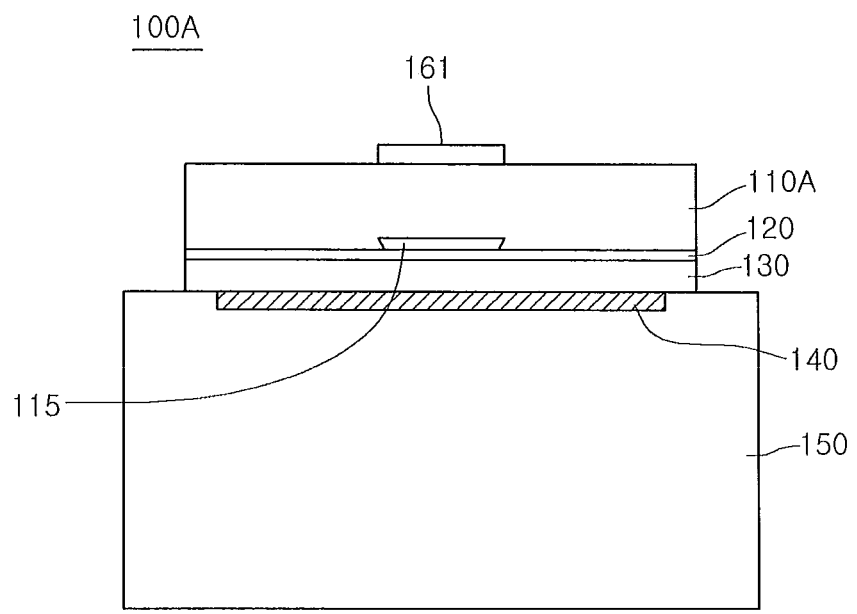
FIG. 16 is a sectional view showing a semiconductor light emitting device according to the second embodiment.

FIG. 16 is a sectional view showing a semiconductor light emitting device according to the second embodiment. In the following description, elements identical to those of the first embodiment will be denoted with the same reference numerals and detailed description thereof will be omitted in order to avoid redundancy.

Referring to FIG. 16, the semiconductor light emitting device 100A according to the second embodiment includes a first conductive semiconductor layer 110A, a carrier blocking layer 115, an active layer 120, a second conductive semiconductor layer 130, an electrode layer 140, a conductive support member 150 and a first electrode 161.

The carrier blocking layer 115 is disposed below the first conductive semiconductor layer 110A. The bottom surface of the carrier blocking layer 115 makes contact with the active layer 120. The carrier blocking layer 115 is provided in the first conductive semiconductor layer 110A.

The carrier blocking layer 115 can diffuse the carriers, which are electrons injected into the first conductive semiconductor layer 110A, in the horizontal direction around the active layer 120.

Figure 17:
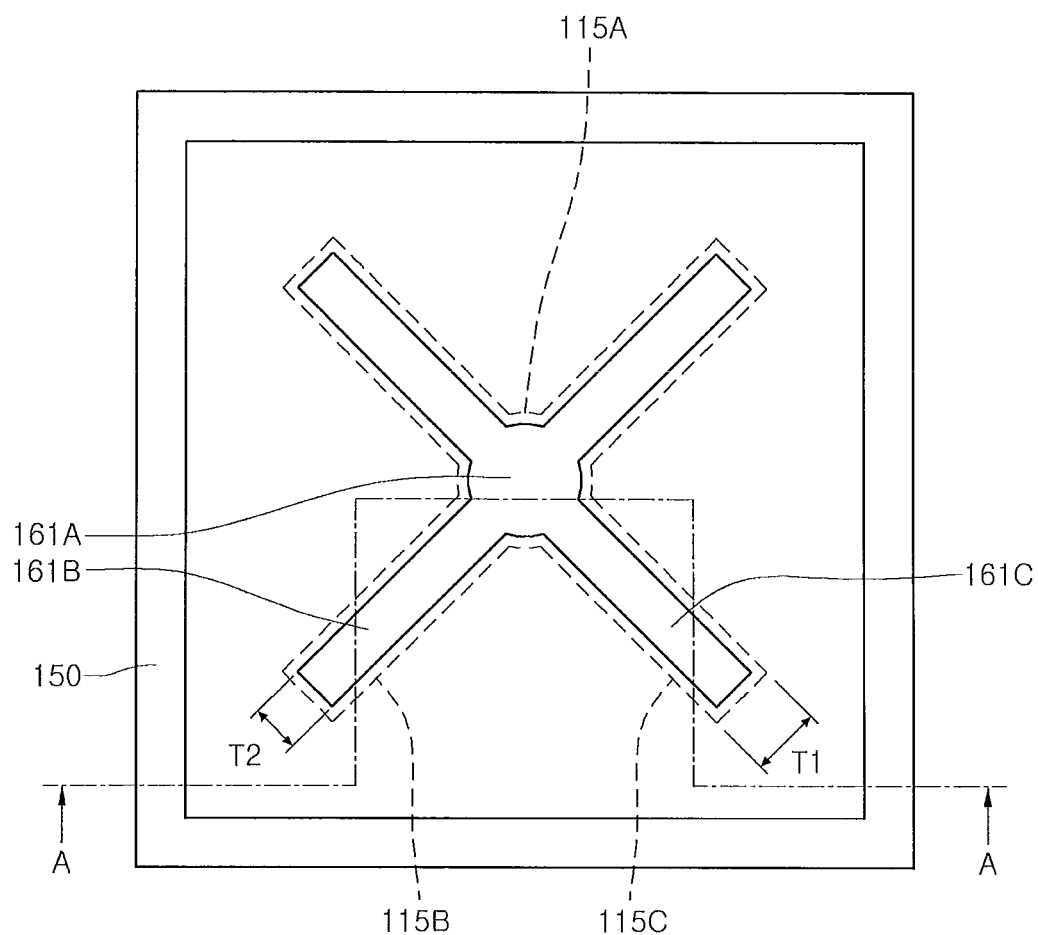
FIG. 17 is a plan view showing a semiconductor light emitting device according to the third embodiment.
Figure 18:
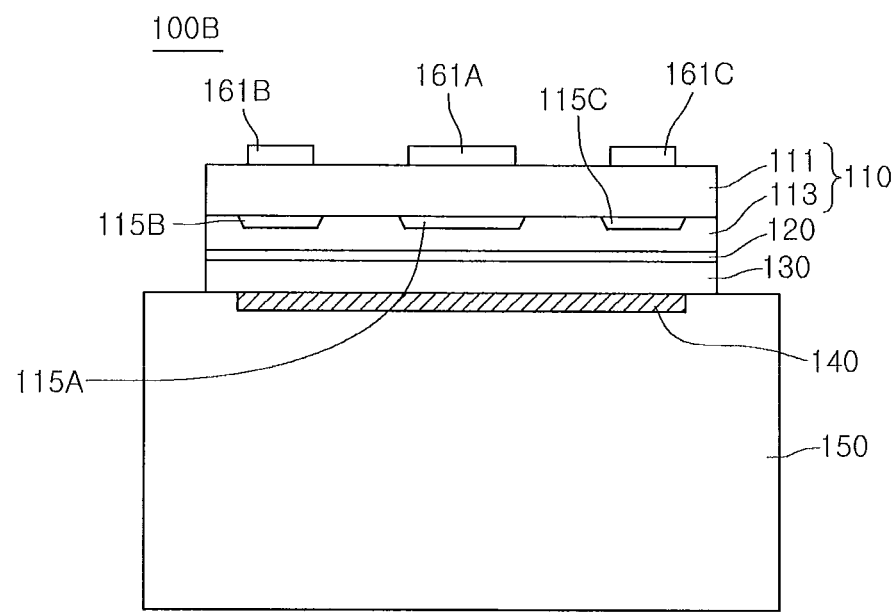
FIG. 18 is a sectional view taken along line A-A of FIG. 17.

FIG. 16 is a plan view showing a semiconductor light emitting device according to the third embodiment, and FIG. 18 is a sectional view taken along line A-A of FIG. 17. In the following description, elements identical to those of the first embodiment will be denoted with the same reference numerals and detailed description thereof will be omitted in order to avoid redundancy.

Referring to FIGS. 17 and 18, the semiconductor light emitting device 100B according to the third embodiment includes a first conductive semiconductor layer 110, carrier blocking layers 115A, 115B and 115C, an active layer 120, a second conductive semiconductor layer 130, an electrode layer 140, a conductive support member 150 and first electrodes 161A, 161B and 161C.

The first electrodes 161A, 161B and 161C are aligned on the first conductive semiconductor layer 110 in a cross pattern. The first electrode pattern 161A positioned in the center may serve as an electrode pad, and the second and third electrode patterns 161B and 161C branching from the first electrode pattern 161A may serve as sub-electrodes. The first electrodes 161A, 161B and 161C may have various patterns within the technical scope of the embodiment.

The carrier blocking layers 115A, 115B and 115C are disposed in the first conductive semiconductor layer 110 while forming a pattern identical to the pattern of the first electrodes 161A, 161B and 161C. The carrier blocking layers 115A, 115B and 115C may have a size larger than that of the first electrodes 161A, 161B and 161C, but the embodiment is not limited thereto.

For instance, the width T2 of the first electrodes 161B and 161C may be smaller than the width T1 of the carrier blocking layers 115B and 115C, but the embodiment is not limited thereto. The carriers injected into the first electrodes 161A, 161B and 161C are diffused in the horizontal direction by the carrier blocking layers 115A, 115B and 115C.

Figure 19:
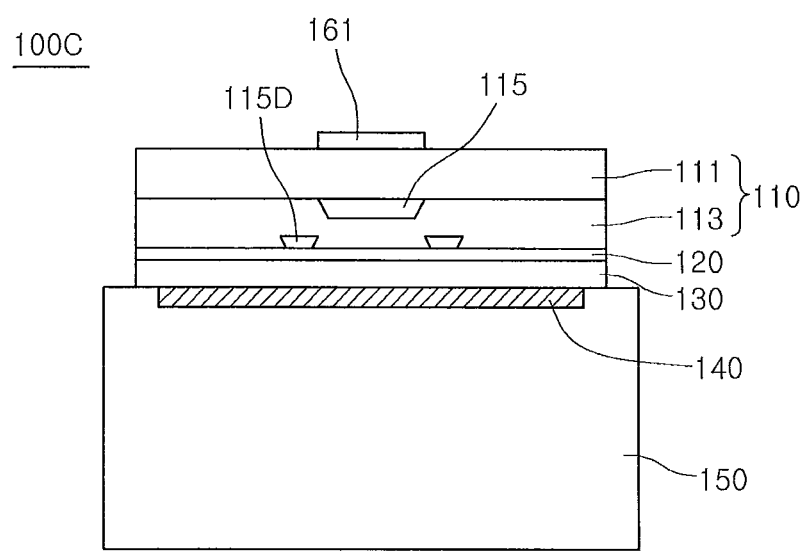
FIG. 19 is a sectional view showing a semiconductor light emitting device according to the fourth embodiment.

FIG. 19 is a sectional view showing a semiconductor light emitting device according to the fourth embodiment. In the following description, elements identical to those of the first embodiment will be denoted with the same reference numerals and detailed description thereof will be omitted in order to avoid redundancy.

Referring to FIG. 19, the semiconductor light emitting device 100C according to the second embodiment includes a first conductive semiconductor layer 110, carrier blocking layers 115 and 115D, an active layer 120, a second conductive semiconductor layer 130, an electrode layer 140, a conductive support member 150 and a first electrode 161.

The carrier blocking layers 115 and 115D may be aligned in different layers in the first conductive semiconductor layer 110. For instance, similar to the first embodiment, the first carrier blocking layers 115 is aligned in the region corresponding to the first electrode 161 to guide the carriers such that the carriers are diffused in the horizontal direction. Meanwhile, the second carrier blocking layer 115D is formed at the interfacial surface between the first conductive semiconductor layer 110 and the active layer to guide the carriers such that the carriers are diffused in the horizontal direction before they are transferred to the active layer 120.

The width of the second carrier blocking layer 115D is identical to or smaller than the width of the first carrier blocking layer 115. The first and second carrier blocking layers 115 and 115D may have the thickness of about 5 nm to 500 nm. The first and second carrier blocking layers 115 and 115D may have the same thickness or the second carrier blocking layer 115D may be thinner than the first carrier blocking layer 115.

In addition, a plurality of second carrier blocking layers 115D, which are spaced apart from each other by a predetermined distance, can be provided while being spaced apart from the first carrier blocking layer 115 by a predetermined distance. The second carrier blocking layers 115D can be aligned around the first carrier blocking layer 115 to further diffuse the carriers, which have been diffused in the horizontal direction by the first carrier blocking layer 115. The second carrier blocking layers 115D make contact with the active layer 120. In addition, the second carrier blocking layers 115D may not make contact with the active layer 120. The second carrier blocking layers 115D are closer to the active layer 120 than the first carrier blocking layer 115.

The first and second carrier blocking layers 115 and 115D may include a semiconductor doped with a second conductive dopant. For instance, the first and second carrier blocking layers 115 and 115D may include one selected from the group consisting of GaN, InN, AlN, InGaN, AlGaN, InAlGaN and AlInN. In addition, the carrier blocking layers 115 and 115D may include a group III-V compound semiconductor having resistance higher than that of the first conductive semiconductor layer 110.

Figure 20:
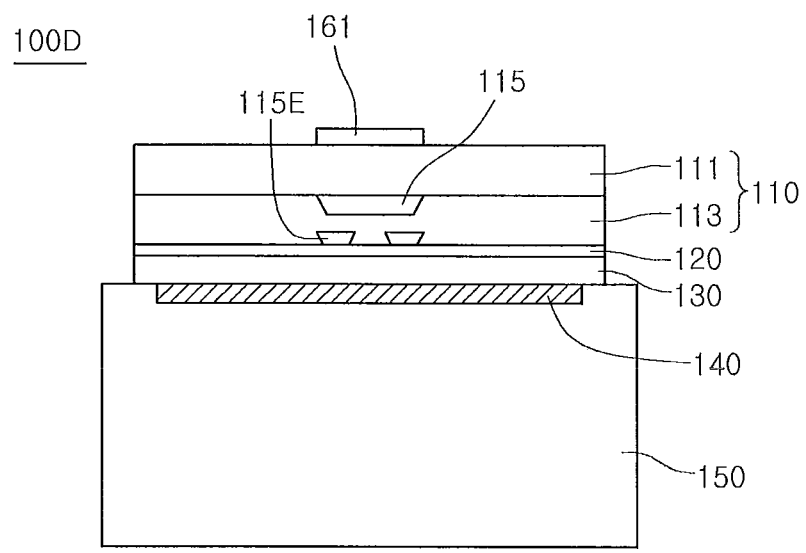
FIG. 20 is a sectional view showing a semiconductor light emitting device according to the fifth embodiment.

FIG. 20 is a sectional view showing a semiconductor light emitting device according to the fifth embodiment. In the following description, elements identical to those of the fourth embodiment will be denoted with the same reference numerals and detailed description thereof will be omitted in order to avoid redundancy.

When comparing with the fourth embodiment, the semiconductor light emitting device 100D according to the fifth embodiment has unique features in second carrier blocking layers 115E. As shown in FIG. 20, according to the fifth embodiment, the two second carrier blocking layers 115E are positioned below the first carrier blocking layer 115. That is, the second carrier blocking layers 115E overlap the first carrier blocking layer 115 in the vertical direction. The second carrier blocking layers 115E can make contact with the active layer 120.

Figure 21:
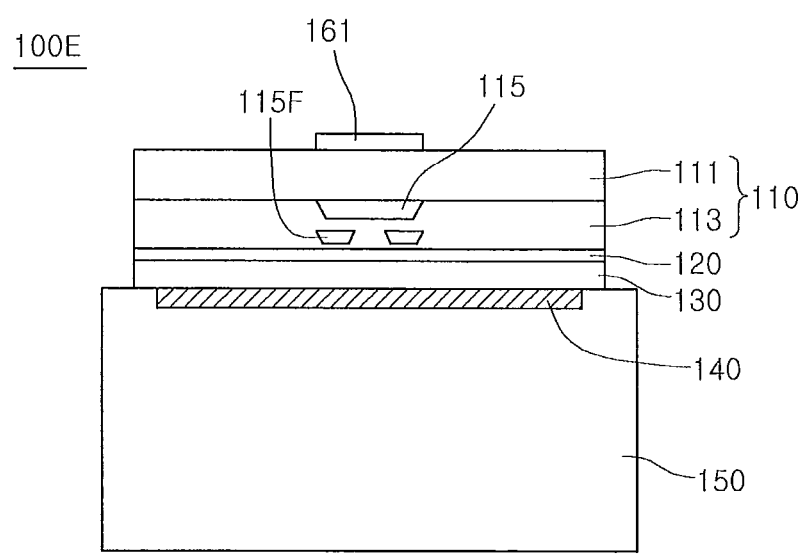
FIG. 21 is a sectional view showing a semiconductor light emitting device according to the sixth embodiment.

FIG. 21 is a sectional view showing a semiconductor light emitting device according to the sixth embodiment. In the following description, elements identical to those of the fourth embodiment will be denoted with the same reference numerals and detailed description thereof will be omitted in order to avoid redundancy.

When comparing with the fourth embodiment, the semiconductor light emitting device 100E according to the sixth embodiment has unique features in second carrier blocking layers 115F. As shown in FIG. 21, according to the sixth embodiment, the two second carrier blocking layers 115F are positioned below the first carrier blocking layer 115. That is, the second carrier blocking layers 115F overlap the first carrier blocking layer 115 in the vertical direction. The second carrier blocking layers 115F are aligned such that they do not make contact with the active layer 120. The second carrier blocking layers 115F are closer to the active layer 120 than the first carrier blocking layer 115.

Figure 22:
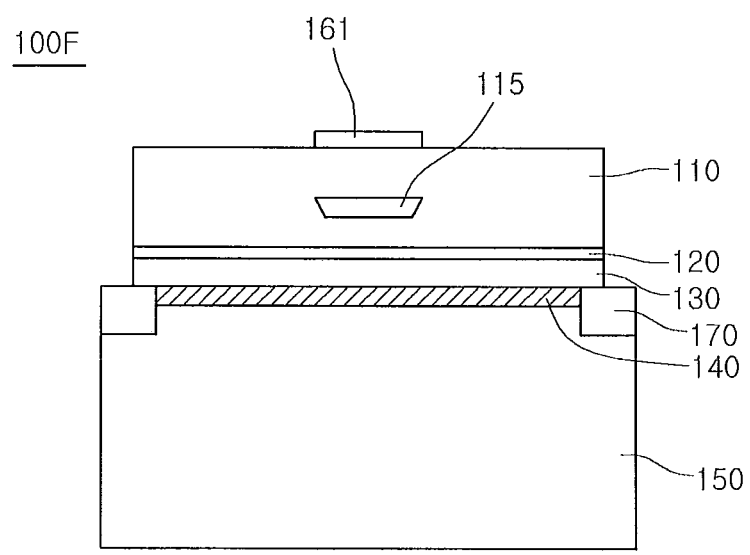
FIG. 22 is a sectional view showing a semiconductor light emitting device according to the seventh embodiment.

FIG. 22 is a sectional view showing a semiconductor light emitting device according to the seventh embodiment. In the following description, elements identical to those of the first embodiment will be denoted with the same reference numerals and detailed description thereof will be omitted in order to avoid redundancy.

The seventh embodiment is different from the first embodiment in that the semiconductor light emitting device 100F according to the seventh embodiment further includes a channel layer 170. The channel layer 170 is aligned around the electrode layer 140. The channel layer 170 is formed on the conductive support member 150. The channel layer 170 may include a conductive transmittive material, such as ITO, IZO, IZTO, IAZO, IGZO, IGTO, AZO, ATO. In addition, the channel layer 170 may include metal oxide, such as TCO (transparent conductive oxide). Further, the channel layer 170 may include an insulating material, such as $SiO_2$, $SiO_x$, $SiO_xN_y$, $Si_3N_4$, $Al_2O_3$, or $TiO_2$. Such a channel layer 170 is also applicable to the second to sixth embodiments.

The carrier blocking layer according to the embodiment can effectively diffuse current in the vertical type semiconductor light emitting device, and can be employed in the horizontal type semiconductor light emitting device as well as the vertical type semiconductor light emitting device.

The semiconductor light emitting device according to the embodiments can be applied to various devices, such as a light emitting device package, a backlight unit, and an illumination device.

The light emitting device package may include a body, a first lead electrode, a second lead electrode, a semiconductor light emitting device according to the embodiments, and a molding member.

The first lead electrode and the second lead electrode may be disposed at the body. The semiconductor light-emitting device may be electrically connected to the first lead electrode and the second lead electrode. The molding member may be configured to mold the semiconductor light emitting device.

The body may be formed to include, for example, silicon material, synthetic resin, or metallic material, and an inclined surface may be formed around the semiconductor light emitting device. The first lead electrode and the second lead electrode may be electrically disconnected from each other, and may provide power to the semiconductor light emitting device. Also, the first lead electrode and the second lead electrode may reflect light emitted from the semiconductor light emitting device, thus increasing light efficiency. Also, the first lead electrode and the second lead electrode may serve to discharge heat generated by the semiconductor light emitting device.

The semiconductor light emitting device may be disposed on the body, or may be disposed on the first lead electrode or the second lead electrode. The semiconductor light emitting device may be electrically connected by, for example, a wire to the first lead electrode, and may be connected to the second lead electrode in, for example, a die-bonding configuration.

The molding member may mold the semiconductor light emitting device to protect the semiconductor light emitting device. Also, a fluorescent material may be included in the molding member to change a wavelength of light emitted from the semiconductor light emitting device.

The semiconductor light emitting device according to embodiments may be packaged in, for example, a semiconductor substrate, an insulating substrate, or a ceramic substrate (such as resin material or silicon).

The semiconductor light emitting device according to the embodiments can be applied to a backlight unit.

The backlight unit can be adapted to a display apparatus such as a liquid crystal display to supply light to the display apparatus. The backlight unit may include a light supply part, a light guide plate, and an optical sheet. The light emitting device package according to the embodiment can be adapted to the light supply part. The backlight unit may not employ the light guide plate.

The semiconductor light emitting device according to the embodiments can be applied to an illumination device.

The illumination device may include a case and a light supply module. The light supply module may be disposed in the case. The light emitting device package according to the embodiments can be adapted to the light supply module.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
   a first conductive semiconductor layer including a first carrier blocking layer of semiconductor material;

an active layer below the first conductive semiconductor layer;

a second conductive semiconductor layer below the active layer;

at least one second carrier blocking layer disposed in the first conductive semiconductor layer and closer to the active layer than the first carrier blocking layer;

an electrode layer below the second conductive semiconductor layer;

a conductive support member below the electrode layer; and a channel layer disposed around the electrode layer and disposed on the conductive support member, the channel layer formed of a conductive transmittive material, a portion of an upper surface of the channel layer exposed outside from a side surface of the second conductive semiconductor layer, wherein the first carrier blocking layer is an undoped semiconductor, wherein the channel layer includes one selected from the group consisting of ITO, IZO, IZTO, IAZO, IGZO, IGTO, AZO, and ATO, wherein the first carrier blocking layer comprises a bottom portion and an upper portion, wherein a lateral width of the upper portion is larger than a lateral width of the bottom portion, and wherein a lateral width of the second carrier blocking layer is smaller than the lateral width of the upper portion of the first carrier blocking layer.

2. The semiconductor light emitting device of claim 1, wherein a bottom surface of the second carrier blocking layer is disposed to contact with a top surface of the active layer.

3. The semiconductor light emitting device of claim 1, further comprising a first electrode disposed on the first conductive semiconductor layer corresponding to the first carrier blocking layer.

4. The semiconductor light emitting device of claim 3, wherein the first carrier blocking layer has a pattern identical to a pattern of the first electrode.

5. The semiconductor light emitting device of claim 3, wherein the first carrier blocking layer has a pattern identical to at least a part of a pattern of the first electrode.

6. The semiconductor light emitting device of claim 3, wherein the first carrier blocking layer is closer to the active layer than the first electrode.

7. The semiconductor light emitting device of claim 1, wherein the second carrier blocking layer includes one selected from the group consisting of GaN, InN, AlN, InGaN, AlGaN, InAlGaN and AlInN, which are doped with a second conductive dopant or not doped with a conductive dopant.

8. The semiconductor light emitting device of claim 1, wherein the first carrier blocking layer has a thickness identical to a thickness of the second carrier blocking layer.

9. The semiconductor light emitting device of claim 1, wherein a plurality of second carrier blocking layers are provided below the first carrier blocking layer while overlapping the first carrier blocking layer in a vertical direction.

10. The semiconductor light emitting device of claim 1, wherein a plurality of second carrier blocking layers are provided below the first carrier blocking layer without overlapping the first carrier blocking layer in a vertical direction.

11. The illumination device comprising the semiconductor light emitting device of claim 1.

12. The semiconductor light emitting device of claim 1, wherein the channel layer improves adhesive strength with the second conductive semiconductor layer to minimize delamination.

13. The semiconductor light emitting device of claim 1, wherein the lateral width of the first carrier blocking layer gradually increases from the bottom portion to the upper portion.

14. A semiconductor light emitting device comprising:

a first conductive semiconductor layer including a first carrier blocking layer of semiconductor material and a second carrier blocking layer below the first carrier blocking layer;

an active layer below the first conductive semiconductor layer;

a second conductive semiconductor layer below the active layer;

an ohmic contact layer below the second conductive semiconductor layer;

an electrode layer below the ohmic contact layer;

a conductive support member below the electrode layer; and a channel layer disposed around the electrode layer and disposed on the conductive support member, the channel layer formed of a conductive transmittive material, a portion of an upper surface of the channel layer exposed outside from a side surface of the second conductive semiconductor layer, wherein the ohmic contact layer includes one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), IrOx, RuOx, RuOx/ITO, Ni, Ag, Ni/IrOx/Au, and Ni/IrOx/Au/ITO, wherein the channel layer includes one selected from the group consisting of ITO, IZO, IZTO, IAZO, IGZO, IGTO, AZO, and ATO, and wherein a lateral width of the second carrier blocking layer is equal to or smaller than a lateral width of the first carrier blocking layer.

15. The semiconductor light emitting device of claim 14, wherein a bottom surface of the second carrier blocking layer is disposed to contact with a top surface of the active layer.

16. The semiconductor light emitting device of claim 14, wherein a bottom surface of the second carrier blocking layer is spaced apart from the active layer.

17. The semiconductor light emitting device of claim 14, wherein the first and second carrier blocking layers are overlapped with each other in a vertical direction.

18. The semiconductor light emitting device of claim 14, wherein the first and second carrier blocking layers are not overlapped with each other in a vertical direction.

19. The semiconductor light emitting device of claim 14, wherein a bottom surface of the first carrier blocking layer is higher than a top surface of the second carrier blocking layer.

* * * * *